United States Patent
Kola et al.

(10) Patent No.: US 6,317,948 B1
(45) Date of Patent: Nov. 20, 2001

(54) EMBEDDED THIN FILM PASSIVE COMPONENTS

(75) Inventors: Ratnaji Rao Kola, Berkeley Heights; Louis Thomas Manzione; Roderick Kent Watts, both of Summit, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/291,781

(22) Filed: Apr. 14, 1999

Related U.S. Application Data

(62) Division of application No. 08/918,216, filed on Aug. 25, 1997, now Pat. No. 6,005,197.

(51) Int. Cl.[7] .................................................... H01G 7/00
(52) U.S. Cl. .............................. 29/25.42; 29/846; 29/847; 29/852; 427/97
(58) Field of Search .............................. 29/846, 847, 852, 29/25.42; 427/97

(56) References Cited

U.S. PATENT DOCUMENTS

| | | | |
|---|---|---|---|
| 4,349,862 | * | 9/1982 | Bajorek ................................. 361/401 |
| 5,530,288 | * | 6/1996 | Stone ..................................... 257/700 |
| 5,636,099 | * | 6/1997 | Suragawara ........................... 361/278 |
| 5,745,334 | * | 4/1998 | Hoffarth ................................ 361/313 |
| 5,770,476 | * | 6/1998 | Stone ..................................... 438/106 |
| 5,972,484 | * | 10/1999 | Cohen ................................... 428/209 |
| 6,005,197 | * | 12/1999 | Kola ...................................... 174/260 |

* cited by examiner

Primary Examiner—Lee Young
Assistant Examiner—Paul D Kim
(74) Attorney, Agent, or Firm—Peter V. D. Wilde

(57) ABSTRACT

The specification describes of multilevel printed circuit boards and a process for their manufacture in which capacitors and other passive components are buried between levels of the multilevel board. The capacitor in the multilevel structure is designed so that access is conveniently provided to connect from the parallel plate electrodes of the interlevel capacitor to the board surface or to another board level using plated through hole interconnects.

11 Claims, 3 Drawing Sheets capacitor          inductor capacitor          inductor

EMBEDDED THIN FILM PASSIVE COMPONENTS

RELATED APPLICATIONS

This application is a division of application Ser. No. 08/918,216 filed Aug. 25, 1997, and now U.S. Pat. No. 6,005,197, issued Dec. 21, 1999.

FIELD OF THE INVENTION

This invention relates to multilevel printed circuit board (MPCB) structures with passive components embedded in interlevel sites in the MPCB.

BACKGROUND OF THE INVENTION

It has been recognized for some time that the density and complexity of interconnections in printed circuit board technology can be increased substantially using multilevel structures. Printed circuits are formed on two or more levels and are interconnected through the board levels using through hole connections or, less typically, with edge connections. Not only is the interconnect density increased for a given board area, but crossovers are substantially simplified.

More recently it has been recognized that further savings in board area can be realized if circuit components as well as interconnects are located in interlevel sites in the MPCB. Typically these devices are thin film passive devices such as resistors, capacitors and inductors. See e.g., T. Lenihan et al, "Embedded Thin Film Resistor, Capacitors and Inductors in Flexible Polyimide Films", 1996 Electronic Components and Technology Conference (IEEE), pp. 119–124.

A simple and cost effective process for implementing this design concept would represent a significant advance in the technology.

Statement of the Invention

A process has been developed for the manufacture of buried capacitor structures using photolithography and thin film processing. A key to the process is the design of the upper capacitor electrode wherein the upper capacitor electrode terminates short of the edge of the lower capacitor electrode on one side of the capacitor, and extends beyond the lower electrode on the other side of the capacitor, thus allowing through hole interconnections to access the buried electrodes of the capacitor.

DETAILED DESCRIPTION

Figure 1:
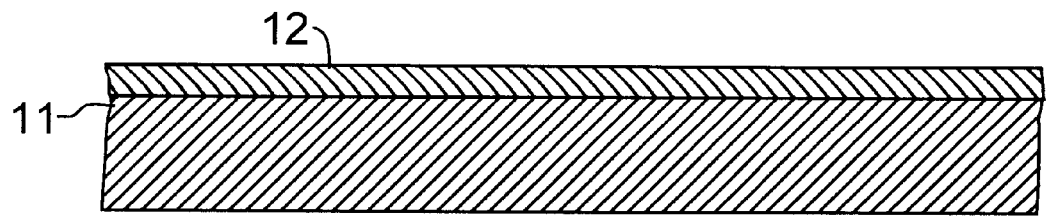
FIGS. 1–11 are schematic representations of the process steps used for forming buried capacitor multi-level printed circuit boards according to the process of the invention.

Referring to FIG. 1, a cutaway section 11 of a single level of a laminated PCB is shown with a layer 12 of tantalum deposited on the surface of the board. The board 11 is shown as a single level at this stage but eventually will become multilevel as will become evident. Board 11 can also be a multilevel board at this stage to which yet another level is being added in this process.

The layer 12 of tantalum is deposited by sputtering or other appropriate deposition technique. Sputtering from a DC magnetron source, at a pressure of 5–20 mtorr flowing argon, and a power density of 0,1–2 W/cm$^2$, are suitable sputtering conditions. The deposition rate at the high power level is approximately 2250 Angstroms/min. An appropriate thickness range for this layer is 1 to 5 $\mu$m.

Figure 2:
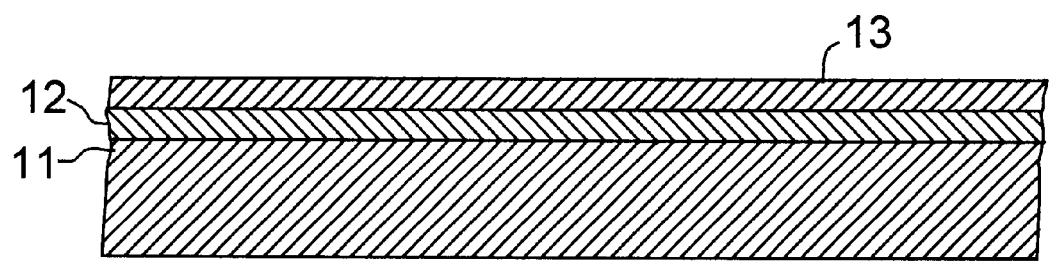

Layer 13 of tantalum nitride is then deposited over layer 12 as shown in FIG. 2. This layer is optional but does improve adhesion of layers subsequently deposited on the structure. A suitable thickness range for layer 13 is 1 to 2 $\mu$m. Layer 13 can be formed in the manner described for layer 12 with the added step of introducing nitrogen in the flowing argon at a concentration in the range 10–30%.

The materials designated for layer 12 and optional layer 13 represents a preferred embodiment. Other capacitor materials may also be suitable, e.g. Ti, Zr, or Al. These materials can be anodized readily to form the capacitor dielectric as will be described below for the preferred choice, Ta.

Figure 3:
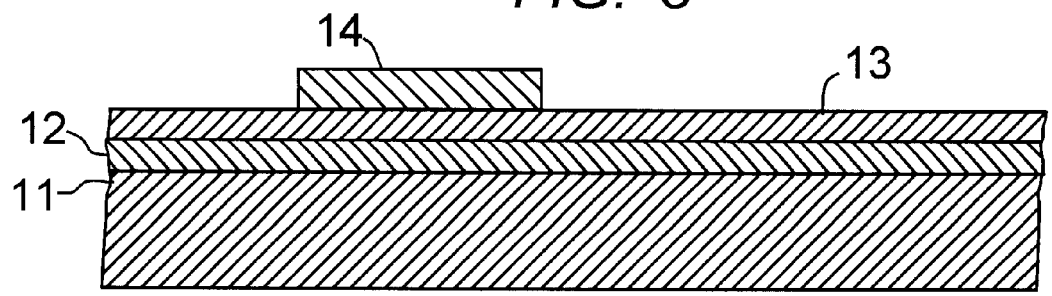

With reference to FIG. 3, layer 12, or layers 12 and 13, are then lithographically patterned using a photomask 14 to define the first electrode of the capacitor. The exposed portions of layer 12, or layers 12 and 13, are removed using a 1:2:4 etch of HF, HNO$_3$ and water, to give the structure shown in FIG. 4.

Figure 4:
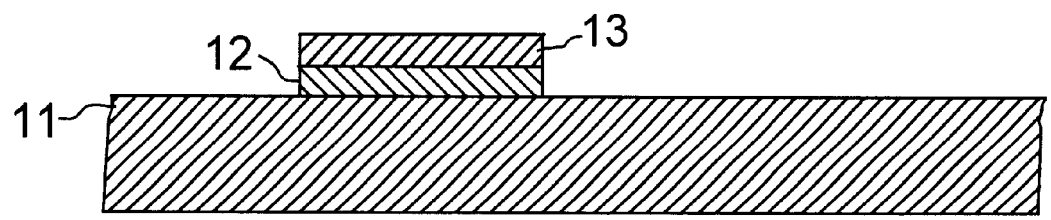
Figure 5:
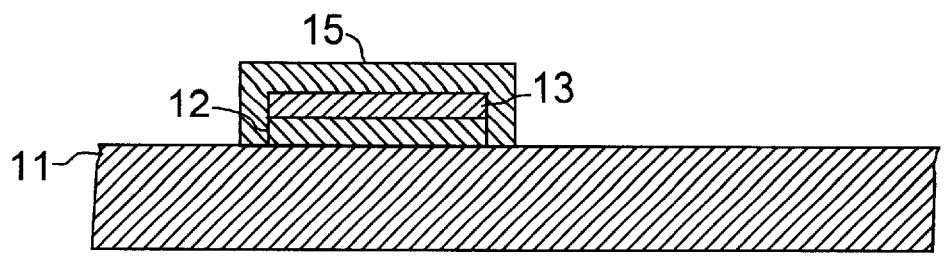

The next step, represented by FIG. 5, is to form the capacitor dielectric by anodizing the first electrode of the capacitor. The board of FIG. 4 is placed in an electrolyte of 0.1 wt. % aqueous citric acid, and anodized using a platinum cathode and a voltage that is ramped at constant current for about 10 minutes to reach 100 V, and held for approximately an hour. The resulting tantalum oxide film is approximately 1800 Angstroms. Other suitable techniques or anodizing conditions can be used. The objective is to form a uniform film in the thickness range 0.05 to 0.5 $\mu$m.

Figure 6:
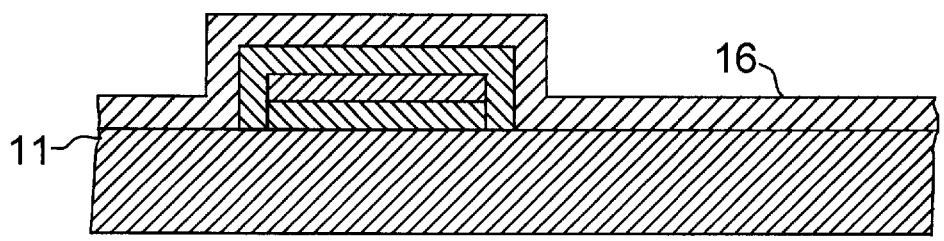

With the capacitor dielectric formed, the second electrode is formed by blanket depositing a metal layer over the structure as shown in FIG. 6. In the preferred embodiment this layer is aluminum, although other suitable conductor materials can be substituted. Aluminum may be DC magnetron sputtered using conditions similar to those given for tantalum sputtering except that higher power levels, i.e. a power density as high as 6 W/cm$^2$ can be used, which deposits the film at a rate of 1 $\mu$m/min. A suitable thickness range for layer 16 is 0.3 to 1 $\mu$m.

Figure 7:
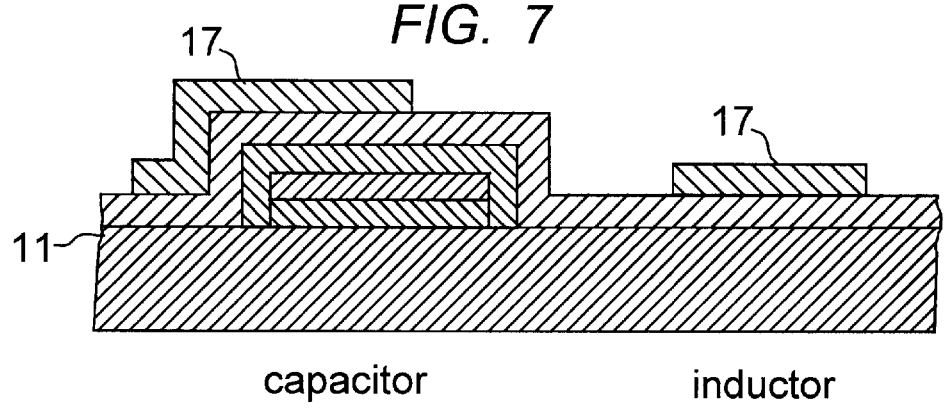

Referring to FIG. 7, layer 16 is patterned photolithographically using photomask 17. For illustration, this step involves the formation of two components, a capacitor as already described, and an inductor to be formed at the site indicated. Etchants for aluminum are well known. A suitable etchant is PAE available from General Chemical Co., Parsippany, N.J.

Figure 8:
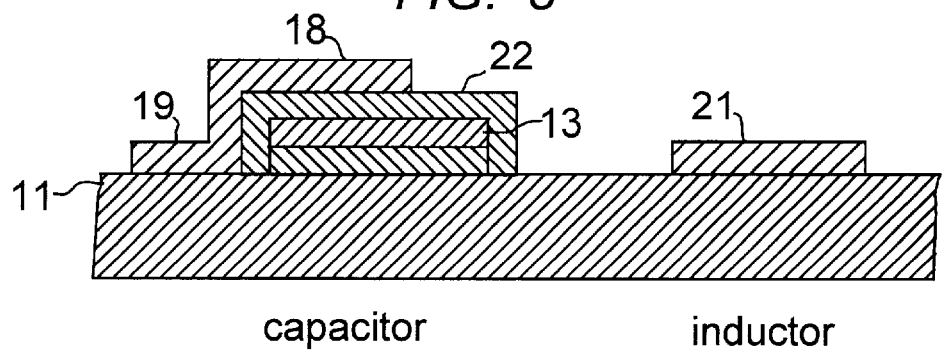

After patterning aluminum layer 16 and removing mask 17 the structure appears as in FIG. 8. The counterelectrode for the capacitor is shown at 18 and a conductive strip which will become the primary element of the inductor is shown at 21. The inductance of the inductor is determined by the dimensions of the spiral strip 21. The formation of multiple components at this stage in the process is an optional feature of the invention. The primary focus of the invention is the formation of the capacitor.

As will occur to those skilled in the art, other components can also be formed using a processing sequence compatible with that described here. For example, the element designated 21 for the inductor in this sequence, can be polysilicon, with the objective of forming a buried resistor. The polysilicon can be deposited e.g. by evaporation or CVD, and patterned lithographically. The same steps as described below for the inductor can be used to complete the resistor. The resistance value is determined by choice of the length and cross section of the strip 21, and/or by modifying the conductivity of the polysilicon by appropriate dopants either during the deposition or with a post deposition implant. It is also convenient and fully compatible with the process as described to form resistors of TaN.

The electrode 18 has two important features that allow effective interconnection to the buried structure. The first is the extended portion 19 that extends beyond the capacitor edge laterally along the surface of the circuit board 11 as shown in FIG. 8. The second is the termination of the conductor 18 at a point spaced from the edge of the capacitor dielectric, leaving a portion 22 of the capacitor dielectric exposed. This portion will later accommodate electrical interconnection to the underlying capacitor electrode 12 (or optionally 12 and 13). The importance of the electrode extension 19, and the exposed insulator portion 22, will become apparent in subsequent processing steps.

The capacitance of the capacitor is primarily determined by the design, i.e. area, of the capacitor plates and the thickness of the capacitor dielectric, but can be further trimmed photolithographically by adjusting the photomask laterally to expose more, or less, of the counterelectrode 18 to be etched away.

The use of photolithography in the steps described is the preferred technique. However, some dimensions may be relatively large by lithography standards. Accordingly, some or all the elements may be formed by other techniques, such as lift-off, or even shadow masking.

Figure 9:
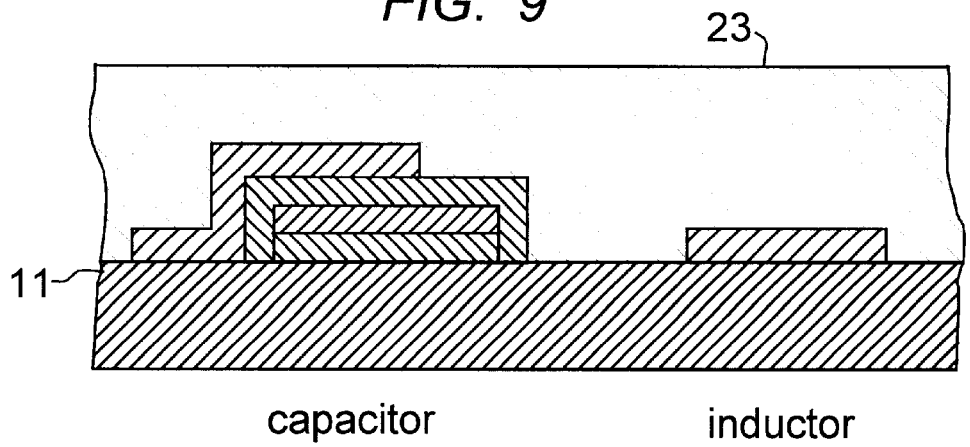

Referring to FIG. 9, a upper circuit board level 23 is bonded to the lower circuit board level to form the MPCB. The means for bonding the layers is preferably an epoxy layer although other non-conducting adhesive techniques may be found useful. Techniques for joining levels of MPCBs are well knwon.

The various elements in the figures are not drawn to scale, which is particularly evident in FIG. 9. The layers of a typical laminate, either rigid or flexible, are substantially thicker than the elements being buried between the layers. The invention will be most effective with circuit board layers that have a moderate degree of resiliency, e.g. polyimide or other polymer materials.

Figure 10:
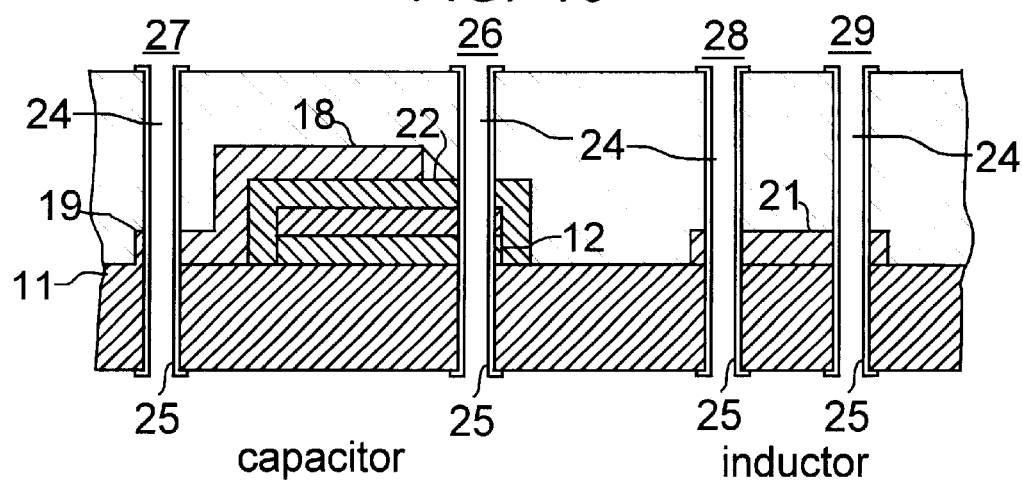

The interconnections to the buried layers are then made, as illustrated in FIG. 10, by forming via holes 24 by standard drilling, and plating the through holes with metal 25 such as copper. The function of the extended portion 19 of electrode 18, and the importance of the non-conductive space 22 left by incomplete coverage of aluminum layer over the capacitor dielectric, are evident in this figure. Thus surface interconnection 26 effectively contacts the lower plate 12 of the capacitor, surface interconnection 27 contacts the electrode tab 19 of the counterelectrode 18 of the capacitor, and surface interconnections 28 and 29 contact the buried inductor 21.

It will be evident to those skilled in the art that the geometric configuration of the capacitor plates may have a variety of forms. Typically the capacitor geometry in plan view is square or rectangular. The inductor may also have a variety of shapes, e.g. spiral.

Figure 11:
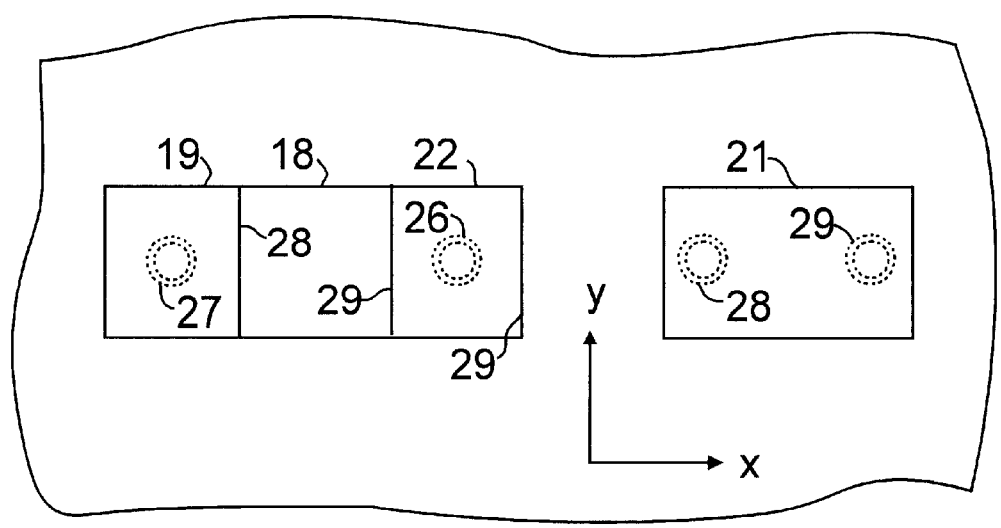

A plan view of a typical device at the processing stage represented by FIG. 8, i.e. with the components visible, is shown in FIG. 11. The portion 11 of the board is cutout from the interior of a large board with typical printed circuits, surface mounted active components, etc., not shown. The exposed portion 22 of the capacitor dielectric appears in this view, and the geometry of the counterelectrode 18 is also shown. The electrode extension 19 is shown as a strip with a width equal to that of the capacitor, but it may have a width larger or smaller than the capacitor width. The interconnect regions that will later be occupied by through hole interconnections, are shown in phantom at 26–29. For reference purposes, the width of the capacitor lies in the y-axis as shown and the length of the capacitor extends along the x-axis. The effective area of the capacitor has a first edge 28, and a second edge 29 parallel to the first edge. The contact location 26 in the first contact region 22, for interconnecting the lower plate of the capacitor, is spaced from the second edge 29 as shown. The extended portion of the electrode 18, shown at 19, extends laterally beyond the first edge 28 of the capacitor along the surface of the printed circuit board level 11, providing a second contact region 19 for the interconnection location 27 to interconnect the upper plate of the capacitor.

For purposes of definition in this description and in the appended claims reference is made to a printed circuit board level as meaning a single laminate or other circuit board material in a multi-level circuit board structure. The multi-level structure may be part of a multi-chip module (MCM) or may be a passive interconnect board or flexible circuit. Also, the term "through hole interconnection" is meant, consistent with terminology widely used in this art, to refer to the standard plated hole that extends through at least one level of the multi-level printed circuit board so as to interconnect a conductor on one side of said board level to a conductor on the other side of that level, i.e. an interlevel conductor, or to a surface conductor on the other side of the multi-level board. Although the through hole interconnection shown in FIG. 10 extends to the surface of the MPCB the interconnection could be between levels in a MPCB with three or more levels.

The capacitor dielectric in the above description is an oxide formed electrolytically by anodizing the first capacitor electrode according to well known tantalum capacitor technology. However, other dielectrics, including nitrides or oxynitrides may also be used. Also the dielectric may be grown by other techniques, e.g. plasma techniques, or it may be deposited by a suitable deposition technique, e.g. CVD.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. A method for the manufacture of a multi-level printed circuit board comprising the steps of:
   a. depositing a first metal layer on the surface of a first printed circuit board level,
   b. patterning said first layer to form a first planar capacitor electrode,
   c. forming a dielectric layer over the first planar electrode,
   d. depositing a second metal layer over the dielectric layer,
   e. patterning said second metal layer to form a second planar electrode, said second planar electrode covering said dielectric layer except for a portion of said insulating layer remaining uncovered, said portion of said insulating layer remaining uncovered providing a first interconnection region, said second planar electrode having an additional portion extending laterally beyond said insulating layer, said additional portion of said second planar electrode providing a second interconnection region,
   f. adhesively bonding a second printed circuit board level to the surface of said first printed circuit board level thereby producing a multi-level printed circuit board, with said first and second planar electrodes, and said dielectric layer buried between said first and second printed circuit board levels, g. forming through holes through at least said second printed circuit board level with a first through hole through said first interconnection region and a second through hole through said second interconnection region, and h. coating said through holes with metal to form electrical contacts to said first and second planar electrodes.

2. The process of claim 1 wherein at least one of steps b. or e. is carried out using photolithography.

3. The process of claim 1 wherein the first metal layer is selected from the group consisting of Ta, Ti, Zr and Al.

4. The process of claim 3 wherein the second metal layer comprises aluminum.

5. The process of claim 3 wherein the dielectric layer is formed by anodizing the first metal layer after patterning the first metal layer.

6. The process of claim 1 wherein step h. involves coating with copper.

7. The process of claim 1 in which the step of patterning the first layer to form a first planar capacitor electrode includes the formation of an inductor layer, and the step of forming through holes includes forming at least two through holes to contact the inductor layer.

8. The process of claim 7 in which the step of patterning the first layer includes the formation of a resistor layer, and the step of forming through holes includes forming at least two through holes to contact the resistor layer.

9. The method of claim 8 in which the resistor layer comprises TaN.

10. The method of claim 1 including the addition step of depositing a resistor material on the surface of said first printed circuit board level, and the step of forming through holes includes forming at least two through holes to contact the resistor material.

11. The method of claim 10 in which the resistor material is polysilicon.

* * * * *